US006613650B1

(12) United States Patent
Holmberg

(10) Patent No.: US 6,613,650 B1
(45) Date of Patent: *Sep. 2, 2003

(54) ACTIVE MATRIX ESD PROTECTION AND TESTING SCHEME

(75) Inventor: Scott H. Holmberg, Pleasanton, CA (US)

(73) Assignee: Hyundai Electronics America, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,111

(22) Filed: May 10, 2000

Related U.S. Application Data

(63) Continuation of application No. 08/782,335, filed on Jan. 13, 1997, now abandoned, which is a continuation-in-part of application No. 08/497,372, filed on Jul. 31, 1995, now Pat. No. 5,668,032.

(51) Int. Cl.[7] ............................................. H01L 21/00
(52) U.S. Cl. ........................... 438/438; 438/30; 349/38
(58) Field of Search ..................... 438/149, 30, 142; 349/38, 40

(56) References Cited

U.S. PATENT DOCUMENTS

| 4,820,222 A | | 4/1989 | Holmberg ............... 438/30 |
|---|---|---|---|
| 5,019,001 A | | 5/1991 | Abe et al. .............. 438/30 |
| 5,019,002 A | | 5/1991 | Holmberg ............... 438/30 |
| 5,532,615 A | | 7/1996 | Kondo et al. ........... 324/77 |
| 5,650,834 A | * | 7/1997 | Yoshida et al. ......... 257/59 |
| 5,668,032 A | | 9/1997 | Holmberg et al. ....... 438/149 |
| 5,742,074 A | | 4/1998 | Takizawa et al. ........ 257/59 |

* cited by examiner

Primary Examiner—Michael Trinh
(74) Attorney, Agent, or Firm—Townsend and Townsend and Crew LLP

(57) ABSTRACT

An improved method of manufacturing active matrix displays with ESD protection through final assembly and in process testing and repair capabilities. At least a first set of shorting bars is formed adjacent the row and column matrix. The shorting bars are respectively coupled to one another in series to allow testing of the matrix elements. A first shorting bar is coupled to the row lines and a second shorting bar is coupled to the column lines. The shorting bars can remain coupled to the matrix through final assembly to provide ESD protection and final assembly and testing capability.

47 Claims, 8 Drawing Sheets

ACTIVE MATRIX ESD PROTECTION AND TESTING SCHEME

This is a continuation of application Ser. No. 08/782,335, filed Jan. 13, 1997 abandoned, which is a continuation-in-part of application Ser. No. 08/497,372, filed Jul. 31, 1995, which issued as U.S. Pat. No. 5,668,032 on Sep. 16, 1997.

BACKGROUND OF THE INVENTION

The present invention pertains to an improved active matrix display and method of making the displays. More particularly, the present invention is directed to a method of making displays including providing enhanced ESD protection, testing and repair to increase the yield of the finished displays.

In recent years there has been growing interest in thin film transistors and devices incorporating such thin film transistors, such as memory arrays, all types of integrated circuits and replacements for mechanical switches and relays. For example, reed relays can fatigue and MOS switches exhibit too much leakage current.

A specific exemplary use of the thin film transistor is in flat panel displays, such as those which employ liquid crystals, field emission, plasma, electrochromic or electroluminescense, as replacements for conventional cathode ray tubes (CRT). The flat panel displays promise lighter weight, less bulk and substantially lower power consumption than CRT's. Also, as consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen that it does to the middle, the beam strikes various points on the screen at different angles with resulting variation in spot size and shape (i.e. distortion).

Flat panel displays are inherently free of such distortion, because each pixel is photolithographically patterned on the substrate as opposed to being defined by where the CRT electron beam strikes the phosphor on the screen. In the manufacture of the flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (emissive) or modulates the transmission of ambient light (nonemissive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. The optically active medium on each contact is generally referred to as a picture element or "pixel".

The circuitry for a flat panel display is generally designed such that data is generally shifted in on all the column lines each to a predetermined voltage. One row is then energized to turn on all the transistors in that row (one row is written at a time). That row is then shut off and the data for the next row is shifted into all the column lines and then the second row is energized and written. This process is repeated until all the rows have been addressed. All the rows are generally written in one frame period, typically about 1/60th of a second or about 16.7 ms. Then voltages representing the data are supplied selectively to particular columns to cause selected pixels to light up or change optical properties as the row is written. The pixels can be made to change intensity by applying a large voltage or current or a longer pulse of voltage or current. Utilizing liquid crystal displays (LCD's) with twisted nematic active material, the display is substantially transparent when not activated and becomes light absorbing when activated or vice versa depending upon polarizer orientation. Thus, the image is created on the display by sequentially activating the pixels, row by row across the display. The geometric distortion described above with respect to CRT's is not a factor in flat panel displays since each pixel location is photolithographically determined and fixed.

One of the major problems that arises with respect to the prior art method of manufacturing structures for active matrix displays (e.g., those employing thin film transistors at each pixel) is that they generally suffer production yield problems similar to those of integrated circuits. That is, the yields of devices produced are generally not 100% and the yield (percentage of devices with no defects) can be 0% in a worst case. High quality displays will tolerate very few defective transistors or other components. Also, larger size displays are generally more desirable than smaller size displays. Thus, a manufacturer is faced with the dilemma of preferring to manufacture larger size and/or higher resolution displays, but having to discard the entire product if more than a few transistors and hence if more than a few pixels are defective. In other words, the manufacturer suffers a radically increased manufacturing cost per unit resulting from decreasing usable product yield.

One problem encountered with making displays is that the plurality of lines and transistors can build up static charges during manufacturing which can damage or destroy the device elements. Prevention of ESD problems will increase the product yield.

Another product yield enhancement can be obtained by testing for and repairing defects in the elements during the display manufacturing steps. One prior art testing technique is to physically probe all the lines individually.

These problems of increased cost and decreased yield were dramatically improved in a prior related invention disclosed and claimed in pending application, entitled ACTIVE MATRIX ESD PROTECTION AND TESTING SCHEME, filed Jul. 31, 1995, U.S. Ser. No. 08/497,372 issued as U.S. Pat. No. 5,668,032, and incorporated herein by reference, by providing a method of manufacturing active matrix displays with a greatly reduced number of defects. The present invention further improves that ESD protection and testing scheme.

SUMMARY OF THE INVENTION

There is provided an improved structure and method of making active matrix displays to eliminate defects in the completed displays. A plurality of shorting bars are provided and interconnected to one another and to all of the row and column lines to provide ESD protection. To allow testing of the row and column lines, at least a first shorting bar is coupled to all the row lines and at least a second shorting bar is coupled to all the column lines. The two shorting bars are connected in series by a resistor having a magnitude on the order of one hundred times the resistance of each shorting bar forming a first set of shorting bars. A second set of shorting bars can be provided coupled in is parallel to the first set of shorting bars. One set of shorting bars can be left connected when the backplane is assembled with the TFT substrate to provide ESD protection for further testing options and assembly.

DESCRIPTION OF THE PREFERRED EMBODIMENTS

Figure 1:
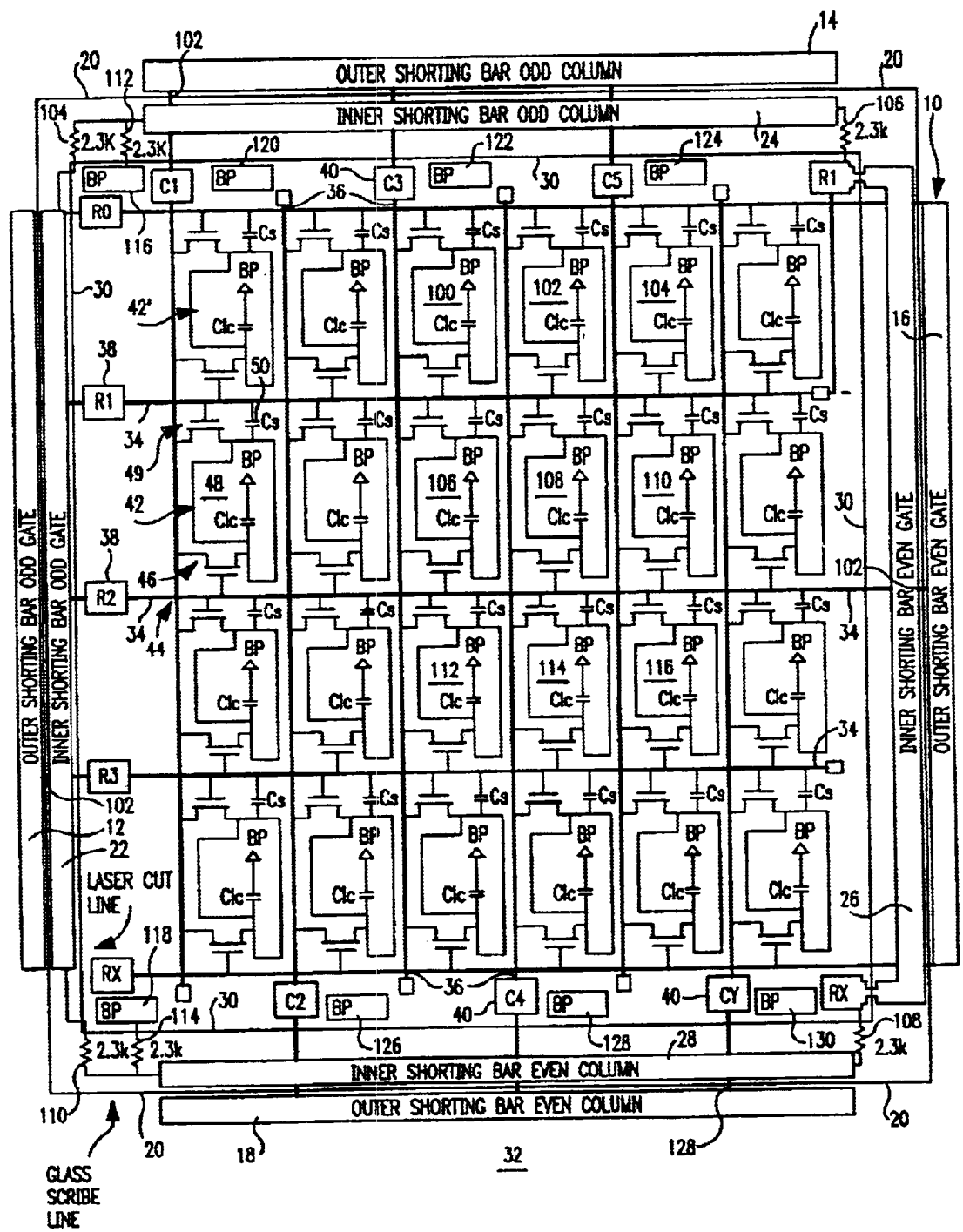
FIG. 1 is a plan view schematic representation of an active matrix display incorporating the ESD and testing technique of the prior invention.

As before mentioned, numerous devices can be formed utilizing thin film transistors (TFT's), one particular utilization is in active matrix liquid crystal displays (AMLCD's) and the TFT of the present invention will be described as a portion of an AMLCD. Referring to FIG. 1, a schematic representation of an AMLCD of the prior invention, U.S. Pat. No. 5,668,032, is designated generally by the reference numeral 10.

The AMLCD 10 is illustrated including a set of optional outer shorting bars 12, 14, 16 and 18. The outer shorting bars 12, 14, 16 and 18 are removed during processing by disconnecting or breaking them away along a scribe line 20, as more fully described hereinafter.

The AMLCD 10 also is illustrated including a set of inner shorter bars 22, 24, 26 and 28. The inner shorting bars 22, 24, 26, and 28 also are utilized during processing, as more fully described hereinafter. However, the inner shorting bars 22, 24, 26 and 28 only are electronically disconnected from the AMLCD 10 along a line 30 such as by a laser, but remain a physical part of the AMLCD 10.

The AMLCD 10 is deposited on a substrate 32, commonly formed from a glass panel, which is broken away along the scribe line 20 as above described. The substrate 32 also can be formed from other types of insulating materials, including for non-light transmissive applications a metallic panel with an insulative coating. The AMLCD 10 is formed with a plurality of row lines 34 and a plurality of column lines 36 forming a large matrix, only a small portion of which is illustrated. The row lines 34 include one of a plurality of driver contact pads 38 connected to each line 34 and the column lines 36 also include one of a plurality of driver contact pads 40 connected to each line 36.

The AMLCD 10 includes a plurality of identical pixels formed between the row lines 34 and the column lines 36, therefore only one pixel 42 will be described in detail. At each matrix crossover point 44, where a row line 34 and a column line 36 cross, a TFT 46 is formed to connect both lines to a pixel contact 48. The active liquid crystal medium is formed at least over the contact 48, which medium will change properties in response to the backplane and data voltages applied to the pixel 42. The medium on the pixel 42 will appear generally as a square, rectangle or dot in the overall matrix of the AMLCD 10. The actual size of the transistor 46 and the contact 48 are not drawn to scale, but are shown schematically for illustration only.

It should be noted that there is no theoretical limit on the number of row lines 34 and column lines 36 that can be employed or on the outside dimension of an AMLCD 10. The processing equipment provides a practical limit on the outside dimension, which limit is continually changing as the equipment is improved.

The problem encountered with manufacturing AMLCD's is that if the AMLCD 10 contains defective TFT's or other circuit elements causing more than a few pixels to be inoperative, the display generally must be discarded. One technique of masking defective pixels 42, is to employ an additional (optional) transistor 49 with the pixel 42 coupling the pixel 42 to an adjacent row R1. Then, when row R1 is written the data is applied not only to the previous pixel 42', but also through the transistor 49 into the pixel 42. When row R2 then is written the data for the pixel 42 is written over the data from the previous pixel through the transistor 46. If, however, the transistor 46 is defective, the pixel 42 will not show as inoperative, but instead will retain the data from the previous row R1. This masks the fact that the pixel 42 is not operating correctly. The pixel 42 also can include a storage capacitor 50 coupled to the row R1 which maintains and stabilizes the voltage written into the pixel 42 during each frame.

Figure 2:
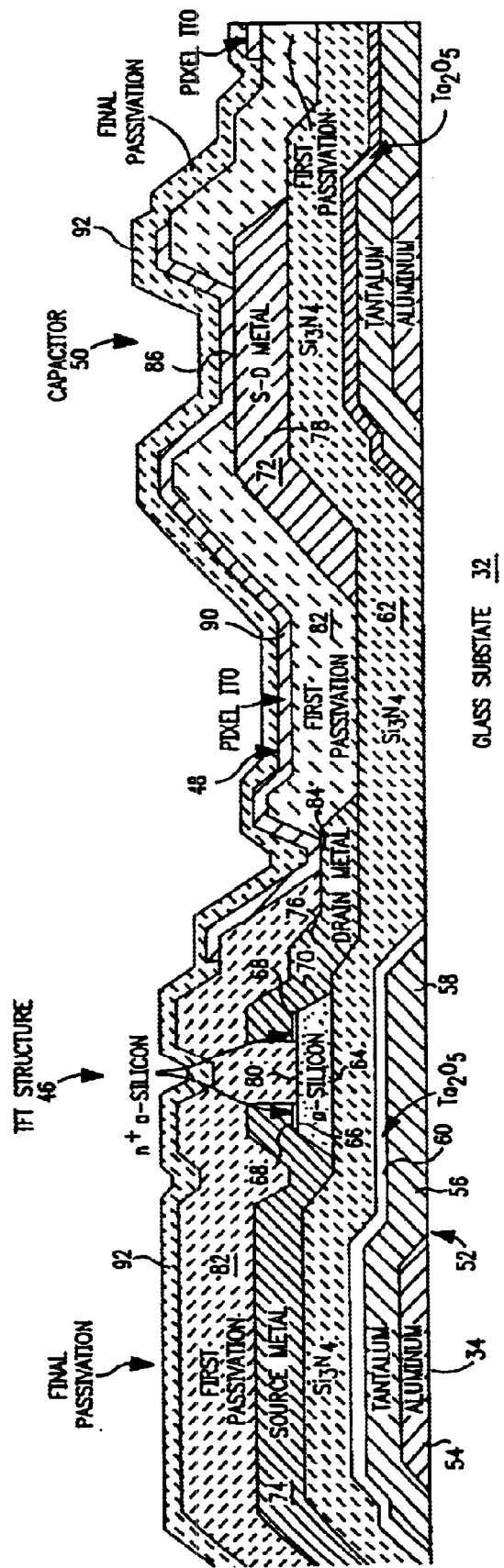
FIG. 2 is a staggered cross-section of one embodiment of a transistor and a storage capacitor which can be utilized in the displays of the present invention.
Figure 3:
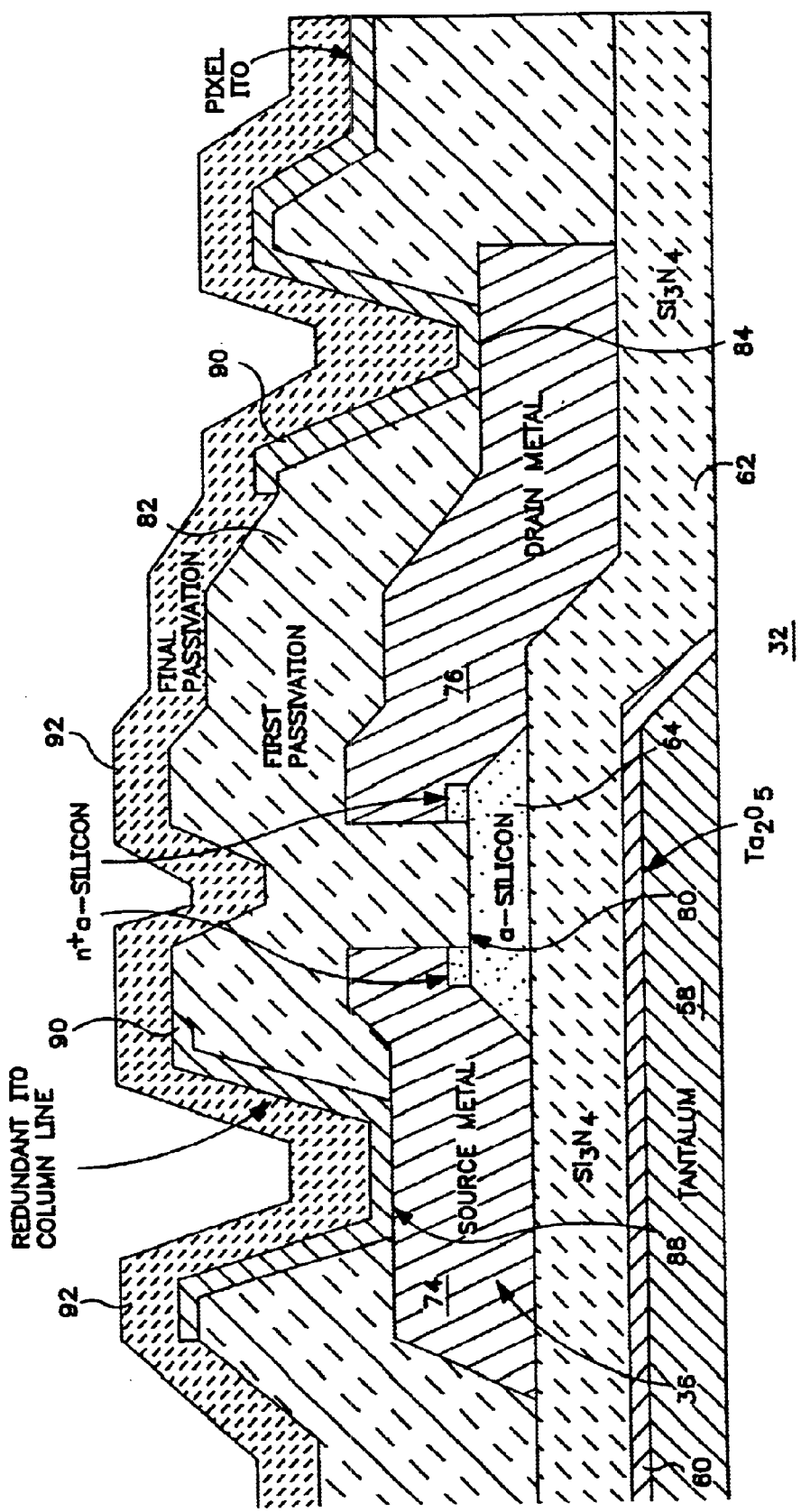
FIG. 3 is a second cross-section of the transistor embodiment of FIG. 2.

The TFT 46 and the AMLCD 10 of the present invention are formed to enhance the yield of active pixels. The TFT 46 will be described with reference to FIG. 2. The TFT 46 is formed with a gate 52 being deposited first as the row line 34. The completed TFT 46 is illustrated in FIGS. 2 and 3, while the various process steps are more fully described in pending application, U.S. Ser. No. 08/497/371, entitled IMPROVED TFT, METHOD OF MAKING AND MATRIX DISPLAYS INCORPORATING THE TFT, filed Jul. 31, 1995, U.S. Pat. No. 5,737,041, and incorporated herein by reference. Although the various layer thicknesses are not critical to the invention, preferable thicknesses and materials are described to form a preferred embodiment of the TFT 46 and the AMLCD 10.

The gate 52 preferably is formed of two layers of metal. A first layer of aluminum, preferably an aluminum alloy, is deposited and patterned to form a line element 54. To form a redundant row line 34, a second gate layer of tantalum is deposited over the aluminum element 54 and patterned to form a line element 56 which covers the element 54. The element 56 also has fingers 58 which form the actual gates for the individual TFT's 46. The line element 54 preferably is formed from aluminum or an aluminum alloy. Aluminum is utilized for long lines because of its high conductivity, but is not critical for small displays and can be eliminated from small displays if desired. The aluminum is deposited to about 1200 Angstroms to provide conductivity, but still be thin enough to prevent step coverage problems over the element 54. The tantalum element 56 or other anodic refractory metal preferably is deposited separately for redundancy to about 2000 Angstroms. The fingers 58 which form the gates for the TFT 46 do not require the aluminum layer and typically are formed only of tantalum.

A first gate insulator layer 60 is then formed by anodizing the exposed tantalum element 56, which is hard anodized to form the insulator layer 60 from tantalum oxide, $Ta_2O_5$. A hard anodization can be performed by utilizing a solution of about 0.1 to 4.0 percent citric acid in deionized water. A voltage of about sixty (60) volts can be utilized which will form a very precise and uniform oxide layer 60 to about fifteen (15) Angstroms per volt or about a thickness of 900 Angstroms. The pads 38 and 40 can be covered with photoresist to prevent anodization of the pads or can be anodized and then later etched.

Alternatively, the first gate insulator 60 can be formed by a deposited dielectric layer. A second or redundant gate insulator 62 then is deposited, preferably silicon nitride, $Si_3N_4$, to a thickness of about 3000 Angstroms. Two additional layers sequentially are deposited, a layer of amorphous silicon 64 and then a layer of N+ doped amorphous silicon 66. The N+ layer 66 and amorphous silicon layer 64 selectively are etched to leave discrete areas 70 over the gate portions 58 on the nitride layer 62. The amorphous silicon layer 64 is deposited to a thickness of about 1500 Angstroms and the N+ layer 66 is deposited to a thickness of about 300 Angstroms. After patterning, the remaining N+ layer forms ohmic contact portions 68.

A reanodization can be performed before the next metal layer is deposited to prevent potential shorts, especially at any point that the drain or source metal overlies the gate metal. The reanodization is performed at a voltage at least twice the maximum voltage normally present between the source and gate lines. The reanodization will form a new oxide in the tantalum or underlying aluminum layer to prevent a later deposited metal from shorting to the gate line through a pinhole which exposed the gate metal.

A source-drain (S-D) layer 72 then is deposited, preferably formed from a plurality of metal layers for large displays. For small displays, the layer 72 can be a single metal layer, such as aluminum or molybdenum. A preferable large device multilayer 72 is formed by depositing a first barrier layer of molybdenum to a thickness on the order of 500 Angstroms. A second conductivity enhancing layer of aluminum or aluminum alloy then is deposited to a thickness of about 5000 Angstroms. A third barrier layer of molybdenum or molybdenum alloy then is deposited to a thickness of about 300 Angstroms. Alternatively, only the first two layers are required to be deposited.

The S-D layer 72 then is patterned to form a source portion 74, a drain portion 76 and a top capacitor contact portion 78. A transistor channel region 80 then is formed between the source and drain portions 74 and 76 by removing the N+ doped layer between the contact portions 68; which remain under the S-D metal portions 74 and 76. At this point the transistor 46 is electrically functional.

The storage capacitor 50 also now is electrically functional and is formed by the contact portion 78 and the underlying portions of the nitride layer 62, the oxide layer 60 and the gate 52. Both the transistor 46 and the capacitor 50 can now be electrically tested, as desired.

A first passivation layer 82 then is deposited, preferably formed of $Si_3N_4$ to a thickness of about 7000 Angstroms.

This dielectric layer also could be formed from deposited $SiO_2$, spin on glass (SOG) or other organic dielectric materials. The layer 82 is patterned to form a drain contact opening 84 and a capacitor contact opening 86. When a redundant column line is to be formed, vias 88 (FIG. 3) are formed to provide contacts to the underlying column line 36.

A pixel ITO layer 90 then is deposited and patterned to form the drain contact at the opening 84, the capacitor contact at the opening 86, the redundant column line by contacting through the vias 88 (where applicable) and the pixel 48. The pixel 48 is not shown to scale and the section is offset to include both the transistor 46 and the capacitor structure 50, which are staggered from one another. The section does not fully illustrate the electrical separation between the column ITO and the pixel ITO 48. The additional transistor 49 (FIG. 1) is not illustrated, but is formed in the same manner as the transistor structure 46.

The TFT structure is then completed by forming a final passivation layer 92. The passivation layer 92 is formed to a thickness of about 2000–3000 Angstroms in the same manner as the layer 82. The layer 92 could also be formed on the color filter substrate or can be formed on both.

Figure 4:
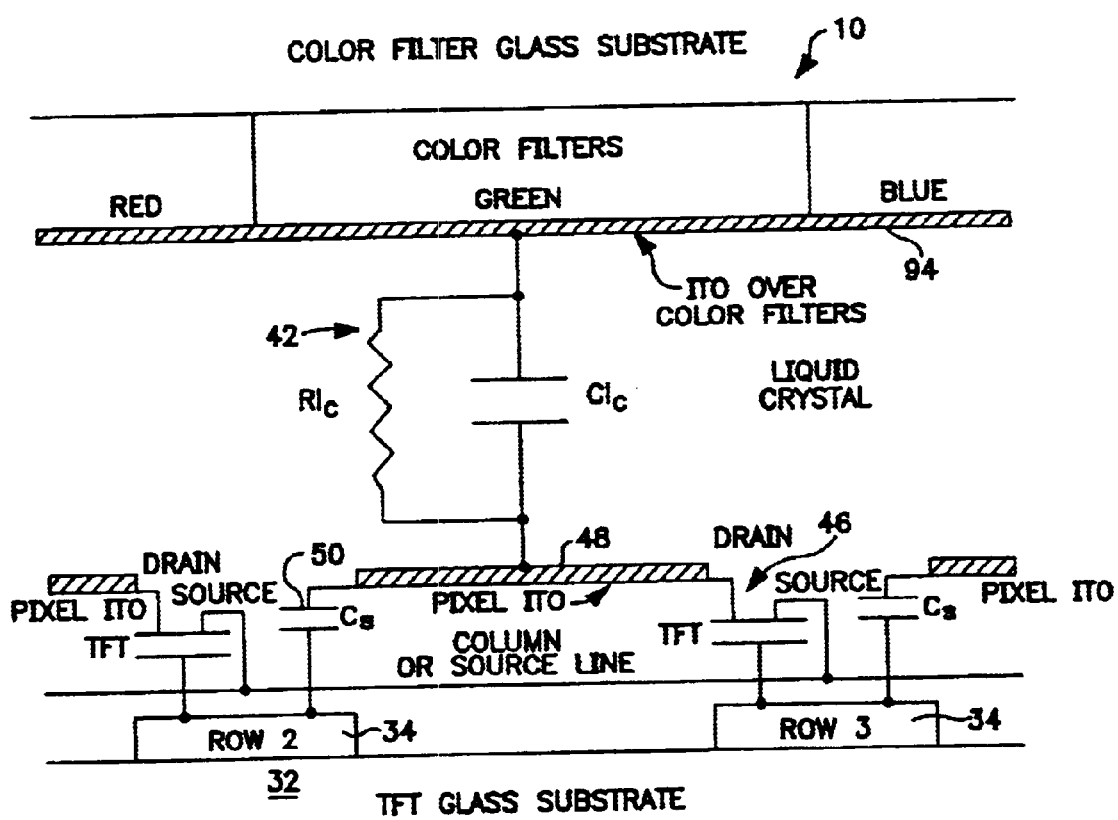
FIG. 4 is a partial diagrammatic view of the completed display.

FIG. 4 illustrates a portion of the completed AMLCD 10 and the reason for utilizing the storage capacitor 50. The capacitor 50 stabilizes the voltage across the liquid crystal material at a pixel 42 during the frame period when the pixel row, here row 3, is not addressed. A given pixel row is only addressed one time during a frame period, which frame is generally $\frac{1}{60}$th of a second or 16.7 milliseconds. For a 480 row AMLCD 10, a given row is only addressed $\frac{1}{480}$ of the frame period or about 34.7 microseconds. During the frame time when the pixel row is not addressed the TFT 46 is off. However, the pixel voltage should remain constant over the liquid crystal material. The liquid crystal material has a capacitance $C_{LC}$ and a finite resistance $R_{LC}$. The transistor 46 can have leakage between the driver and source and/or through the liquid crystal material resistance $R_{LC}$. To minimize the voltage drop (data decay) across the liquid crystal material the storage capacitor 50 with capacitance $C_S$ is formed in parallel with $C_{LC}$. The pixel 42 driven by the transistor 46 from Row 3 is coupled to the previous Row 2 by the capacitor 50. This assumes that Row 2 is driven just before Row 3. When the transistor 46 for a given row turns on, the transistor 46 charges $C_{LC}$ and $C_S$ since the total capacitance is equal to $C_{LC} + C_S$. The leakage currents of both the transistor 46 and the liquid crystal material are higher (worse) at higher operating temperatures. The liquid crystal material is contained between the TFT substrate 32 and a color filter or monochrome backplane 94. The backplane 94 is separated by spacers (not illustrated) from the substrate 32.

As previously discussed, the AMLCD 10 can suffer ESD damage during manufacture. Further both row (gate) 34 and column (source) 36 lines as well as the TFT's 46 and 49 can include defects caused by various manufacturing problems, such as debris particles. It would be desirable to provide ESD protection and to test for and repair defects during manufacture of the AMLCD's 10.

Figure 5:
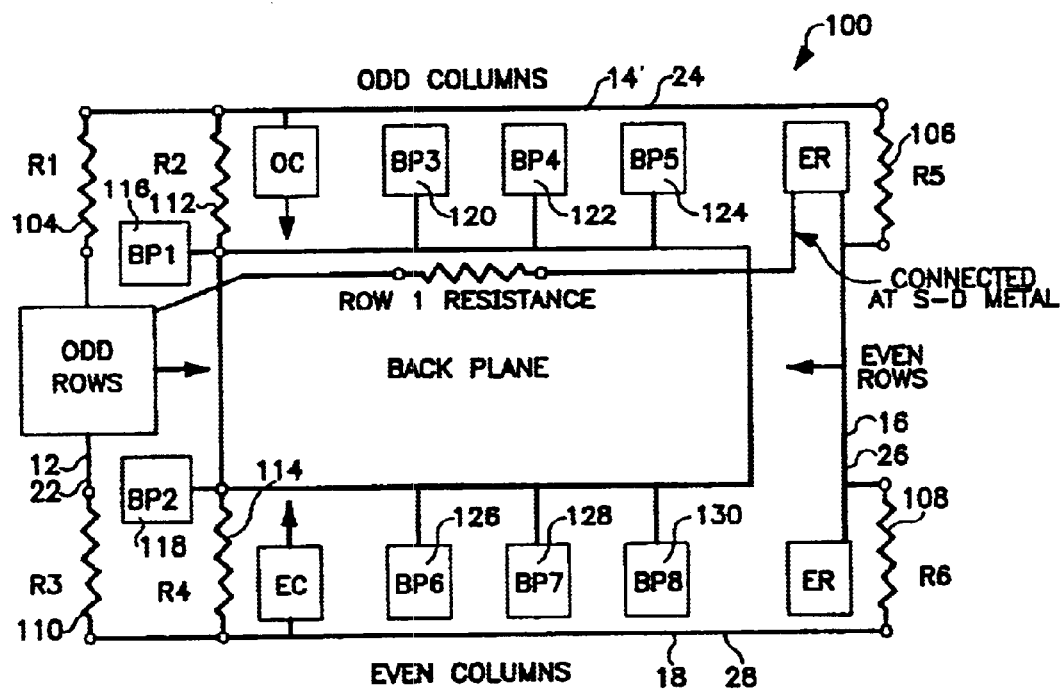
FIG. 5 is a diagrammatic view of the ESD protection and testing technique of the prior invention.

Referring to FIGS. 1 and 5, the ESD protection and testing techniques are best illustrated. An overall schematic 100 of the ESD protection and testing techniques is illustrated in FIG. 5. The outer shorting bars 12, 14, 16, and 18 are connected by the respective inner shorting bars 22, 24, 26 and 28 by a plurality of lines 102 (FIG. 1). The shorting bars are shown as single bars 12, 22; 14, 24; 16, 26 and 18, 28 in FIG. 5.

Although shorting bars have been utilized in prior art display manufacturing, it is not believed that resistive connected shorting bars and inner shorting bars which are not physically removed have previously been utilized. The bars 12, 22; 14, 24; 16, 26 and 18, 28 have a resistance on the order of 15 to 20 ohms. The bars are connected in series by a plurality of resistors 104 (R1), 106 (R5), 108 (R6) and 110 (R3) being a resistance on the order of 100 times the resistance of the bars, for example 2.3 Kohms. The magnitude of the resistors 104, 106, 108 and 110 allow the displays to be tested during the manufacturing steps, while also providing ESD protection since the bars are interconnected to one another and to all the row and column lines 34 and 36.

Since the odd and the even row and column lines 34, 36 are connected together to one of the bars 12, 14, 16 and 18, testing all odd or even row or column lines 34, 36 can be accomplished utilizing a single test point on the respective bars 12, 14, 16 and 18. Also, since the two sets of shorting bars are interconnected, clearly the outer set of shorting bars 12, 14, 16 and 18 can be eliminated to increase packing density of the displays during manufacture. A plurality of AMLCD's typically are manufactured simultaneously on a single substrate. If the outer shorting bars 12, 14, 16 and 18 are eliminated, a contact point preferably would be utilized for test probing.

Referring to FIG. 2, the bars 12, 22; 14, 24; 16, 26 and 18, 28 are formed by depositing them from the metal layer in the overall device structure. The bars 12, 22; 14, 24; 16, 26 and 18, 28 and the resistors 104, 106, 108 and 110 are formed with the gate (row) lines 34 of the two metal layers 54 and 56. Once the gate lines 34 are deposited, they then can be treated for opens or shorts by probing on the bars 12, 22 and 16, 26 to drive the even rows in one polarity and the odd rows in the opposite polarity. One method of testing for opens is to sense the voltages on the lines utilizing an in process tester (IPT). An open in a line or a short between a line can be cured by a laser deposition step or laser cutting of the shorted portion.

Two additional backplane resistors 112 (R2) and 114 (R4) are formed with the resistors 104, 106, 108 and 110, as well as a pair of backplane test pads 116 and 118. These resistors 112 and 114 also can be tested and repaired at this step. The test pads 116 and 118 are connected to the backplane 94 when the AMLCD 10 is completed as illustrated in FIG. 4.

A plurality of backplane drive pads 120, 122, 124, 126, 128 and 130 are deposited with the gate lines 34 and/or with the column lines 36. These pads are then connected to the backplane 94 when the AMLCD 10 is assembled with the backplane.

When the column lines 36 are deposited, the source metal 74 also can be deposited over the shorting bars 12, 22; 14, 24; 16, 26 and 18, 28 to decrease the resistance of the bars. Further, the odd column lines 36 are connected to the inner and outer column shorting bars 14, 24 and the even column lines 36 are connected to the inner and outer column shorting bars 18, 28. The row line 34 can again be tested and the column lines 36 also can be tested as previously described. Further, the row lines 34 and the column lines 36 can be tested for shorts between the rows and columns. Once the TFT's 46 and 49 are completed by clearing the channel 80, the TFT's also can be tested and repaired.

After the final layer 92 has been formed on the substrate 32 and the final testing and repairs have been completed, the outer shorting bars 12, 14, 16 and 18 can be removed along the scribe line 20. The backplane 94 then can be assembled on the substrate 32 and filled with liquid crystal material.

ESD protection is still provided by the inner shorting bars 22, 24, 26 and 28, which also are connected to the backplane 94 by the backplane contacts 116 and 118 and the resistors 112 and 114. The complete AMLCD 10 then can be tested with all elements prior to connecting the drive electronics modules to the row pads 38 and the column pads 40.

The drive electronics modules (not illustrated) then can be bonded to the pads 38 and 40, while the inner shorting bars 22, 24, 26 and 28 still are connected. Once the module connections to the pads 38 and 40 have been tested, the bars 22, 24, 26 and 28 are disconnected along the laser line 30 with a laser focused through the glass substrate 32. The ESD protection then is provided by the electronics modules themselves.

Figure 6:
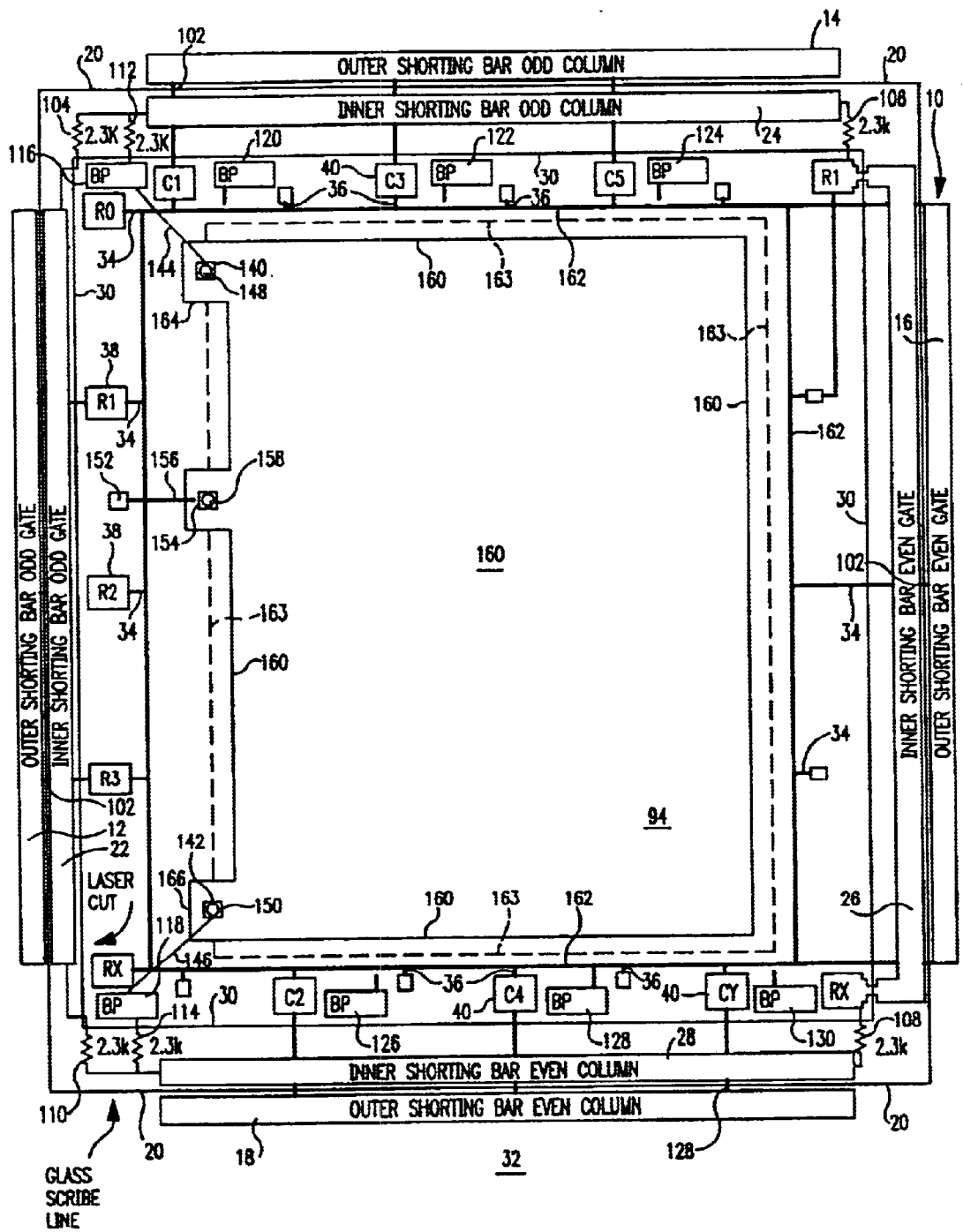
FIG. 6 is a plan view schematic representation of the interconnections between the backplane and substrate of the prior invention.

Referring to FIG. 6, the interconnection of the substrate 32 and the backplane 94 is best illustrated. Although previously described with a plurality of backplane drive pads 120, 122, 124, 126, 128 and 130, the interconnection will be described herein with respect to at least one of the pads 116 and 118. The drive pads 120, 122, 124, 126, 128 and 130 are left disconnected, but otherwise could also be connected as will be described with the pads 116 and 118.

The pads 116 and 118 each are coupled to a respective contact pad 140 and 142 by a respective line 144 and 146, all formed on the substrate 32. The pads 116 and 118 also include the respective resistors 112 and 114, only one of which is preferred, and both of which can be deleted. The pads and lines 140, 142, 144 and 146 are underneath the backplane glass 94. The backplane 94 is connected to the pads 144 and 146 by a respective conductive epoxy connection 148 and 150, such as a conventional silver epoxy. The connections 148 and 150 are formed when the substrate and the backplane 94 are pressed together.

An additional pair of sensing pads 152 and 154 can be formed on the substrate 32 and connected by a line 156. The pads 152 and 154 can be connected to the backplane 94 by an epoxy connection 158 at the same time as the connections 148 and 150. The scale and placement of the pads and connections are illustrated only for convenience of description.

In a like manner the ITO pattern 160 is illustrated, not to scale, but for convenience of description. The ITO pattern 160 is spaced from a free edge 162 of the backplane 94, sufficient to allow the backplane 94 and the substrate 32 to be sealed together adjacent the edge 162 in a conventional manner spaced from and without contacting the ITO pattern 160 as indicated by a dashed line 163. The ITO pattern includes a plurality of fingers 164, 166 and 168, each coupling the ITO 160 to the respective connection 148, 150 and 158.

Figure 7:
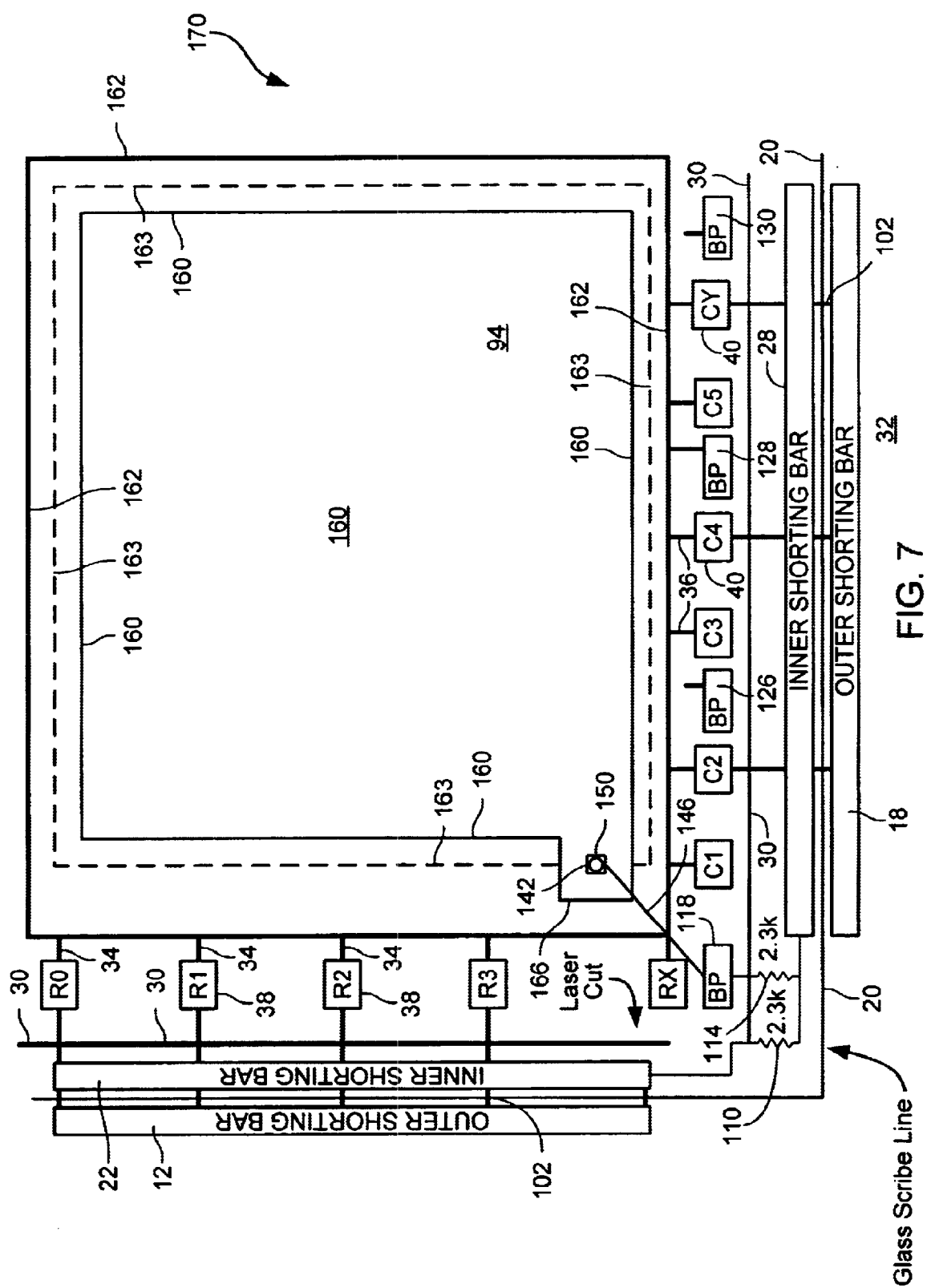
FIG. 7 is a plan view schematic representation of an active matrix display incorporating the ESD technique of the present invention.

Referring now to FIG. 7, the ESD improvements of the present invention are best illustrated by an AMLCD embodiment 170. The AMLCD 170 is substantially identical in electronic structure to the AMLCD 10 with respect to the row lines 34, the column lines 36 and the pixels 42 with the pixel related structure. Therefore, the details of the matrix are omitted to more clearly illustrate the interconnections of the ESD improvements of the present invention.

The AMLCD 170 is designed to provide the substantially identical electronic matrix and ESD protection, but on a smaller substrate 32. This reduction in scale is achieved as a tradeoff. One set of column shorting bars is omitted. For example purposes only, shorting bars 14 and 24 are omitted. This requires that all the column driver contact pads 40 (for both odd and even column lines) be formed on one side adjacent and coupled to the remaining set of shorting bars 18 and 28.

In a like manner, one set of row shorting bars is omitted. For example purposes only, shorting bars 16 and 26 are omitted. The row driver contact pads 38 all are formed adjacent and coupled to the remaining set of shorting bars 12 and 22. This reduced area or reduction in scale tradeoff is achieved by eliminating the independent driving and hence the independent testing of the even and odd row and column lines as provided by the AMLCD 10.

Only one resistor 110 now remains between the two sets of shorting bars 12, 22 and 18, 28. Also, as described in FIG. 6, the backplane drive pads 120, 122 and 124 have been eliminated, while the backplane drive pads 126, 128 and 130 have been illustrated as disconnected. One or more of these drive pads can be connected as described with respect to the pad 118 or additional pads can be utilized if desired. The sensing pads 152 and 154 and the connection 158 described with respect to FIG. 6, preferably would be included for test purposes, but have not been illustrated.

The ITO pattern 160 is illustrated with only the single interconnection 150 on the finger 166 connected to the pad 118, as previously described with respect to FIG. 6. Further, the contact pad RO and the exposed or free ends of the pair of shorting bars 12, 22 and 18, 28 are moved and/or terminated to align inside the corresponding backplane edges 162, again to reduce the area of the completed AMLCD 170. Also, the backplane resistor 114 is preferred, but is not required and can be eliminated. The contact pad 142 and the interconnection 150 are illustrated formed with the ITO finger 166 in the corer between the two sets of shorting bars 12, 22 and 18, 28. The interconnection 150 also could be formed adjacent the pad RO or in the corner adjacent and connected to the backplane pad 130. Alternately, two or all three of the interconnections could be formed, if desired.

The AMLCD 170 can be utilized to reduce the size of the completed AMLCD from that of the AMLCD 10. There remains a potential problem which can be caused when bonding the drive electronics modules (not illustrated) to the pads 38 and 40. The modules conventionally are bonded by utilizing a bonding tape (not illustrated). The tape is intended to provide vertical connections without any lateral conductive paths between the conductors. The tape is compressed, however, and can be squished laterally from one or more of the pads 38 or 40 onto the inner shorting bars 22 or 28. The tape then can block the laser from removing or cutting the line 30 between the shorting bars 22 or 28 and the adjacent pads 38 or 40. One way of eliminating this problem is to laser cut along the line 30, before bonding the drive modules. However, this can cause an ESD problem when bonding the modules and the pads 38 and 40.

Figure 8:
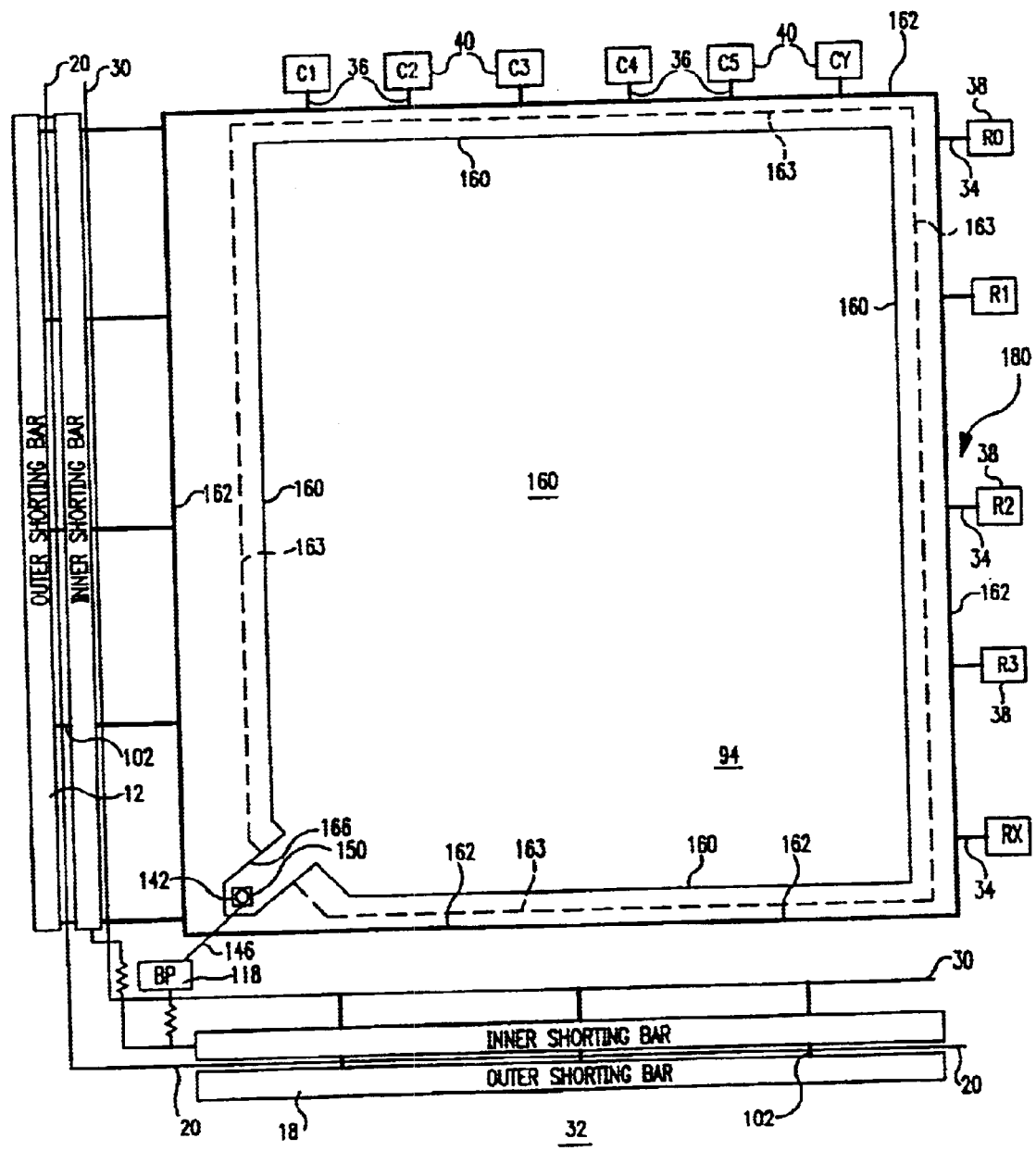
FIG. 8 is a plan view schematic representation of an active matrix display incorporating an alternate embodiment of the ESD technique of the present invention.

A second way of eliminating the laser disconnect problem is illustrated by the AMLCD embodiment 180 in FIG. 8. In the completed AMLCD 180, the AMLCD can require even less area than the AMLCD 170. The row lines 34 remain connected to the shorting bars 12 and 22, but the row line pads 38 are placed on the opposite side of the backplane 94. In a like manner, the column lines 36 remain connected to the shorting bars 18 and 28, but the column line pads 40 also are placed on the opposite side of the backplane 94. Again, only the one interconnection 150 is illustrated, but it could be relocated or be more than one interconnection, as desired. The pad 118 can be moved into the corner of the AMLCD 180 as illustrated to further reduce the size of the completed AMLCD 180. In this case, the edge 162 adjacent the shorting bar 28 can be located much closer, like the edge 162 adjacent the shorting bar 22. Since the pads 38 and 40 are now located opposite the shorting bars 12, 22 and 18, 28, the bonding tape for the electronics module is no longer a concern.

Also, since the pads 38 and 40 are now located on the opposite side of the backplane 94, the inner shorting bars 22 and 28 also can be physically removed. The AMLCD liquid crystal seal 163 is located between the free edge 162 and the ITO pattern 160. The shorting bars 22 and 28 can be removed by laser, by physically cutting, by grinding the top of the substrate or by grinding the edge of the substrate 32 to the free edge 162 on the sides of the AMLCD 180 adjacent the shorting bars 22 and 28. The cutting or grinding ensures the shorting bars 22 and 28 are electronically disconnected, since they physically are removed. Further, this additional physical removal of the substrate 32 can further reduce the overall size of the completed AMLCD 180.

Thus, for a trade off of decreased interim testing capability between odd and even row or column lines, the AMLCD can be decreased in size. Since the row and column lines are laterally spaced from one another, such testing although desirable, is not as essential as the testing provided by the shorting bars. If there is a short between adjacent row or column lines, then the error will not be found until the electronic drivers are bonded to the pads 38 and 40 for final testing.

Many modifications and variations of the present invention are possible in light of the above teachings. It is therefore, to be understood that within the scope of the appended claims, the invention may be practiced otherwise than as specifically described.

What is claimed is:

1. A method of manufacturing active matrix displays comprising a plurality of thin film transistors, each transistor couple a pixel to a row line and a column line in the matrix displays, said method comprising:

forming at least a first set of inner shorting bars, each having a first resistance adjacent to the display matrix on a first substrate, coupling in parallel a first one of said shorting bars to all the row lines and coupling in parallel a second one of said shorting bars to all the column lies; and coupling said shorting bars to one another by a resistor having a magnitude about one hundred times greater tan the first resistance.

2. The method as defined in claim 1 further comprising forming at least a second set of outer shorting bars adjacent said first set of shorting bars and coupling each one of said second set of shorting bars to a respective one of said first set of shorting bars.

3. The method as defined in claim 1 further comprising forming said first set of shorting bars with said row lines.

4. The method as defied in claim 3 further comprising forming said column lines from metal connected to said second shorting bar.

5. The method as defined in claim 4 further comprising depositing said column line metal onto said first set of shorting bars to decrease the resistance of said shorting bars.

6. The method as defined in claim 4 further comprising forming a transistor and a pixel pad for each intersection of column and row lines and testing said transistors and said pixels with said shorting bars.

7. The method as defined in claim 6 further comprising coupling a backplane on a second substrate to said first substrate including a liquid crystal material therebetween and including coupling said backplane to said first set of shorting bars to provide ESD protection.

8. The method as defined in claim 7 further comprising providing display drive electronics and bonding the display drive electronics to said first substrate to couple the drive electronics to the substrate and testing the drive electronics coupling.

9. The method as defined in claim 8 further comprising decoupling said first set of shorting bars from said backplane, said row lines and said column lines after said drive electronics coupling is tested.

10. The method as defined in claim 9 further comprising testing said first set of shorting bars to ensure that the bars are decoupled.

11. The method as defined in claim 9 further comprising decoupling said shorting bars from said row lines and said column lines by utilizing a laser to open the couplings between said shorting bars and said row lines and column lines.

12. The method as defined in claim 11 further comprising decoupling said shorting bars from one another.

13. The method as defined in claim 7 further comprising:
 forming at least one interconnection pad on said first substrate and coupling said backplane to said interconnection pad;
 forming a sensing pad on said first substrate and separately coupling said backplane to said sensing pad;
 driving said backplane to a specified voltage from said interconnection pad; and
 testing said actual backplane voltage from said sensing pad.

14. The method as defined in claim 7 further comprising forming separate driver contact pads on said first substrate for each said row line and each said column line.

15. The method as defined in claim 14 further comprising providing display drive electronics and bonding the display drive electronics to said driver contact pads to couple the display electronics to the pads and testing the display electronic couplings.

16. The method as defined in claim 15 further comprising forming said driver contact pads on said substrate on the opposite side from said shorting bars.

17. The method as defined in claim 16 further comprising decoupling said shorting bars from said row lines and said column lines by physically removing said shorting bars.

18. The method as defined in claim 1 further comprising forming each shorting bar of said first set of shorting bars having a resistance of about 20 ohms and forming said resistor having a resistance of at least 2000 ohms.

19. A method of manufacturing active matrix displays comprising a plurality of thin film transistors, each transistor coupling a pixel to a row line in the matrix displays, said method comprising:
 forming at least a first set of inner shorting bars adjacent to the display matrix on a first substrate, each shorting bar having a first resistance;
 coupling in parallel, a first one of said shorting bars to all the row lines;
 forming row driver contact pads adjacent said display matrix on a side opposite said first one of said shorting bars;
 coupling in parallel, a second one of said shorting bars to all the column lines;
 forming column driver contact pads adjacent said display matrix on a side opposite said second one of said shorting bars; and
 coupling said shorting bars to one another by a resistor having a magnitude about one hundred times greater than the first resistance.

20. The method as defined in claim 19 further comprising decoupling said first and second shorting bars from said column lines and said row lines.

21. The method as defined in claim 20, wherein said decoupling further comprises physically removing said first and second sing bars from said first substrate.

22. The method as defined it claim 21, wherein said removing is performed by a laser physically cutting to an edge of said display matrix adjacent said first and second one of said shorting bars.

23. The method as defined in claim 21, wherein said removing is performed by grinding the top of said substrate to an edge of said display matrix adjacent said first and second one of said shoring bars.

24. The method as defined in claim 21, wherein said removing is performed by grinding an edge of said substrate up to an edge of said display matrix adjacent said first and second one of said shorting bars.

25. The method as defined in claim 19 further comprising forming at least a second set of outer shorting bars adjacent said first set of shorting bars and connecting each one of said second set of shorting bars to a respective one of said first set of shorting bars.

26. The method as defined in claim 19 further comprising forming said first set of shorting bars with said row lines.

27. The method as defined in claim 26 further comprising forming said column lines from metal coupled to said second shorting bar.

28. The method as defined in claim 27 further comprising depositing said column line metal onto said first set of shorting bars to decrease the resistance of said shoring bars.

29. The method as defined in claim 27 further comprising forming a transistor and a pixel pad for each intersection of column and row lines and testing said transistors and said pixels with said shorting bars.

30. The method as defined in claim 29 further comprising coupling a backplane on a second substrate to said first substrate including a liquid crystal material therebetween and including coupling said backplane to said first set of shorting bars to provide ESD protection.

31. The method as defined in claim 30 further comprising providing display drive electronics and bonding the display drive electronics to said first substrate to couple the drive electronics to the substrate and testing the drive electronics coupling.

32. The method as defined in claim 31 further comprising decoupling said first set of shorting bars from said backplane, said row lines and said column lines after said drive electronics coupling is tested.

33. The method as defined in claim 32 further comprising testing said first set of shorting bars to ensure that the bars are decoupled.

34. The method as defined in claim 32 further comprising decoupling said shorting bars from said row lines and said column lines by utilizing a laser to open the couplings between said shorting bars and said row lines and column lines.

35. The method as defined in claim 34 further comprising decoupling said shorting bars from one another.

36. The method as defined in claim 30 further comprising:
 forming at least one interconnection pad on said first substrate and coupling said backplane to said interconnection pad;
 forming a sensing pad on said first substrate and separately coupling said backplane to said sensing pad;
 driving said backplane to a specified voltage from said interconnection pad; and
 testing said actual backplane voltage from said sensing pad.

37. The method as defined in claim 30 further comprising forming separate row and column drivers contact pads on said first substrate for each said row line and each said column line.

38. The method as defined in claim 37 further comprising providing display drive electronics and bonding the display drive electronics to said row and column driver contact pads to couple the display electronics to the pads and testing the display electronic couplings.

39. The method as defined in claim 38 further comprising decoupling said shorting bars from said row lines and said column lines by physically removing said shorting bars.

40. The method as defined in claim 19 further comprising forming each shorting bar of said first set of shorting bars having a resistance of about 20 ohms and forming said resistor having a resistance of at least 2000 ohms.

41. A method of manufacturing active matrix displays comprising a plurality of thin film transistors, each transistor coupling a pixel to a row line in the matrix displays, said method comprising:

forming at least a first set of finer shorting bars adjacent to the display matrix on a first substrate, each shorting bar having a first resistance;

coupling in parallel, a first one of said shorting bars to all the row lines;

forming row driver contact pads adjacent said display matrix on a side adjacent said first shorting bar;

coupling in parallel, a second one of said shorting bars to all the column lines;

forming column driver contact pads adjacent said display matrix on a side adjacent said second shorting bar; and coupling said shorting bars to one another by a resistor having a magnitude about one hundred times greater than the first resistance.

42. The method as defined in claim 41 further comprising decoupling said first and second shorting bar from said column lines and said row lines.

43. The method as defined in claim 42, wherein said decoupling further comprises physically removing said first and second shorting bar from said first substrate.

44. The method as defined in claim 43, wherein said removing is performed by a laser physically cutting to an edge of said display matrix adjacent said fist and second one of said shorting bars.

45. The method as defined in claim 43, wherein said removing is performed by grinding the top of said substrate to an edge of said display matrix adjacent said first and second one of said shorting bars.

46. The method as defined in claim 43, wherein said removing is performed by grinding an edge of said substrate up to an edge of said display matrix adjacent said first and second one of said shorting bars.

47. The method as defined in claim 41 further comprising coupling a third shorting bar to said first shorting bar and coupling a fourth shorting bar to said second shorting bar.

* * * * *

UNITED STATES PATENT AND TRADEMARK OFFICE
CERTIFICATE OF CORRECTION

PATENT NO.     : 6,613,650 B1                                              Page 1 of 1
DATED          : September 2, 2003
INVENTOR(S)    : Scott H. Holmberg It is certified that error appears in the above-identified patent and that said Letters Patent is hereby corrected as shown below:

Column 10,
Line 30, replace "couple" with -- coupling --
Line 37, replace "lies" with -- lines --
Line 40, replace "tan" with -- than --
Line 48, replace "defied" with -- defined --

Column 12,
Line 3, replace "sing" with -- shorting --
Line 4, replace "it" with -- in --
Lines 11 and 27, replace "shoring" with -- shorting --
Line 65, replace "drivers" with -- driver --

Column 13,
Line 17, replace "finer" with -- inner --

Column 14,
Line 13, replace "fist" with -- first --

Signed and Sealed this

Twenty-eighth Day of October, 2003

JAMES E. ROGAN
*Director of the United States Patent and Trademark Office*